United States Patent [19]

Yoshikawa et al.

[11] Patent Number: 5,070,274
[45] Date of Patent: Dec. 3, 1991

[54] METHOD FOR MAKING DIAMOND AND APPARATUS THEREFOR

[75] Inventors: Masanori Yoshikawa, Yokohama; Haruo Tateno, Kiyose; Hiroshi Obana, Tokyo; Tsutomu Itoh, Musashino; Hiroshi Saitoh, Funabashi; Masayuki Kitoh, Tokyo, all of Japan

[73] Assignee: Onoda Cement Company, Ltd., Onoda, Japan

[21] Appl. No.: 496,235

[22] Filed: Mar. 20, 1990

[30] Foreign Application Priority Data

Mar. 20, 1989 [JP] Japan .................................. 1-67999

[51] Int. Cl.$^5$ ............................................. C01B 31/06
[52] U.S. Cl. ............................ 315/111.21; 315/111.91; 313/231.31; 313/231.41; 423/446
[58] Field of Search ....................... 315/111.21, 111.81, 315/111.91; 313/231.31, 231.41; 423/446

[56] References Cited

U.S. PATENT DOCUMENTS

| | | | |
|---|---|---|---|
| 3,248,513 | 4/1966 | Sunnen | 313/231.41 X |
| 3,644,782 | 2/1972 | Sheer et al. | 315/111.21 |
| 4,163,891 | 8/1979 | Komatsu et al. | 313/231.41 X |
| 4,767,608 | 8/1988 | Matsumoto et al. | 423/446 |
| 4,767,641 | 8/1988 | Kieser et al. | 315/111.21 X |
| 4,803,405 | 2/1989 | Nakano et al. | 315/111.21 |
| 4,830,702 | 5/1989 | Singh et al. | 423/446 X |
| 4,915,977 | 4/1990 | Okamoto et al. | 423/446 X |
| 4,940,015 | 7/1990 | Kobashi et al. | 315/111.21 X |
| 4,961,958 | 10/1990 | Desphandey et al. | 423/446 X |

Primary Examiner—Eugene R. LaRoche
Assistant Examiner—Do Hyum Yoo
Attorney, Agent, or Firm—Price, Heneveld, Cooper, Dewitt & Litton

[57] ABSTRACT

An arc is formed between a pair of discharge electrodes, a plasma gas separated from a raw material gas flowing substantially in parallel to the arc to form a plasma flame, the raw material gas flowing to the upstream within the plasma flame, and a diamond being deposited on the substrate downstream within the flame.

20 Claims, 12 Drawing Sheets

METHOD FOR MAKING DIAMOND AND APPARATUS THEREFOR

BACKGROUND OF THE INVENTION

1. Field of the Invention

This invention relates to a method of and an apparatus for producing or making a diamond whose properties, such as for example hardness, heat conductivity, and electrical insulation, are superior to other materials. More particularly, the invention relates to a method of and an apparatus for inexpensively and quickly producing or making the diamond whose properties are the same or superior to natural diamond and which does not contain any impurities.

Artificial diamond making methods are basically classified into two categories: one is an extra-high pressure high temperature method and the other includes low pressure CVD methods.

The former method involves reaction and synthesization in a container under tens of thousands of atmospheric pressure and at several thousands of temperatures. An apparatus thereof is thus extremely expensive.

The latter, low pressure CVD methods, includes a DC plasma method, a heat filament method, a microwave CVD method, a spattering method and an ionized deposition method, and an apparatus thereof is generally far less expensive than compared with an apparatus for the extra-high pressure high temperature method.

Any of the low pressure CVD methods, excluding the DC plasma method, are inferior to the extra-high pressure high temperature method in that they are relatively slow in their production speed, for example, at most several +10 μm per hour in generating speed of diamond films. On the other hand, the DC plasma method, using a rather inexpensive apparatus, allows high speed production of 180 to 250 μm per hour.

Several methods of diamond production by such a DC plasma method have been found. One is a DC arc plasma method and the other is a DC plasma jet method. The former is constructed as shown in FIG. 18 in which an arc 3 is generated between an anode 1 and a cathode 2, and a mixture of hydrogen gas 13 and methane gas serving as a raw material gas 12 flows to a direction intersecting with the arc 3. On the downstream side of a supply opening of a raw material gas feed tube 9 and under the arc 3 is arranged a substrate 5 where the diamond is produced on the surface thereof.

In FIG. 18, numeral 4 indicates a plasma flame, 6 a cooling water inflow tube, 7 a cooling water spill tube, 8 a DC power supply and 11 a gas outlet of a container 10, respectively.

The latter, the DC plasma jet method, is constructed as shown in FIG. 19, wherein a cylindrical anode 1 is disposed around a cylindrical cathode 2, and a mixture of hydrogen gas 13 and methane gas 12 serving as a raw material gas 12, and plasma gas 14 flow through a cylindrical passageway 16.

In FIG. 19, numeral 22 indicates an insulating material.

The above two methods, compared with other CVD methods, are remarkably quick in production speed, 180 to 250 μm per hour, which is equal to the extra-high pressure high temperature method.

In these methods, a plasma generating apparatus, a substrate supporting device, a substrate cooling apparatus and the like are incorporated in an atmosphere regulative container, where diamond is produced by hydrogen and methane gases with an arc 3.

Such methods have the following disadvantages:

1. In the DC arc discharge method, the flow of a mixture gas perpendicular to the arc does not allow a sufficient time for reaction.

2. In the DC plasma jet method, because of the fact that a gas for generating a plasma is a mixture gas for producing diamond, precipitation of the partial carbon in the plasma generating apparatus is responsible for electric short circuiting between the anode 1 and the cathode 2, and thus it is difficult to generate a stable arc.

3. Further, owing to the same reason as above, i.e. the electric short circuiting between the two electrodes in a short time, the raw material gas cannot increase in its density.

The synthesizing speed in these methods is not capable of exceeding 250 μm per hour. Further, a sufficient amount of active hydrogen atom generated in the plasma flame is required for increasing the purity of the diamond produced on the substrate. In either of the DC plasma methods, however, the reaction of hydrogen does not progress, which results in insufficient generation of active hydrogen. Consequently, the diamond is not rapidly produced on the substrate. As an impurity which determines the properties of the diamond, carbon left behind in the process of producing the diamond is precipitated as amorphous carbon or graphite-like carbon.

SUMMARY OF THE INVENTION

It is an object of the present invention to provide the same or a more rapid production speed as compared with the extra-high pressure high temperature method in diamond production using a plasma and to keep the purity of the diamond produce high.

The characteristics of the invention is to assuredly separate plasma gas required for plasma generation, for example O group elements like argon and helium, or nitrogen, or a mixture of these and hydrogen gas serving as a raw material gas, and to prolong the time for the raw material gas to react by feeding the raw material gas to a plasma flame after the plasma flame generation so that energy required for such reaction increases.

Another characteristics of the invention is that the raw material gas flows not into the atmosphere around the plasma flame, but into the plasma flame, and thus activated hydrogen and material gases contained in the plasma flame react efficiently, which leads to improved use of the raw material gas.

In an apparatus for and a method of producing the diamond according to this invention, the arc is generated to feed the plasma gas in substantially the same direction as the arc, both to the center and the circumference of the arc, thus forming the plasma flame.

The reasons for feeding the plasma gas in substantially the same direction as the arc are, for example, that the plasma flame is far more stably formed compared with the case where the plasma gas is fed perpendicularly to the arc, that the plasma flame is formed for a much longer time, and that the longer length of the arc for the distance between the discharge electrodes can be generated. The same large size apparatus would thus be able to form a plasma flame with high energy.

In this invention, the raw material gas, separated from the plasma gas, is directly fed to the plasma flame. The reason for this is that the plasma gas contains only the gas necessary for the plasma generation and after the plasma flame is certainly generated, the raw material gas containing carbon is directly fed to the plasma flame where the reaction takes place.

For the reasons above, the plasma flame is stably formed and such a problem as carbon precipitation in a plasma torch and the like does not occur.

Other features and advantages of the invention will be apparent from the following Description of the Preferred Embodiments when read in light of the attached drawings.

DESCRIPTION OF THE PREFERRED EMBODIMENTS

The embodiments of this invention are described in connection with the accompanying drawings, in which components denoted by like numerals have the same names and functions.

Figure 1:
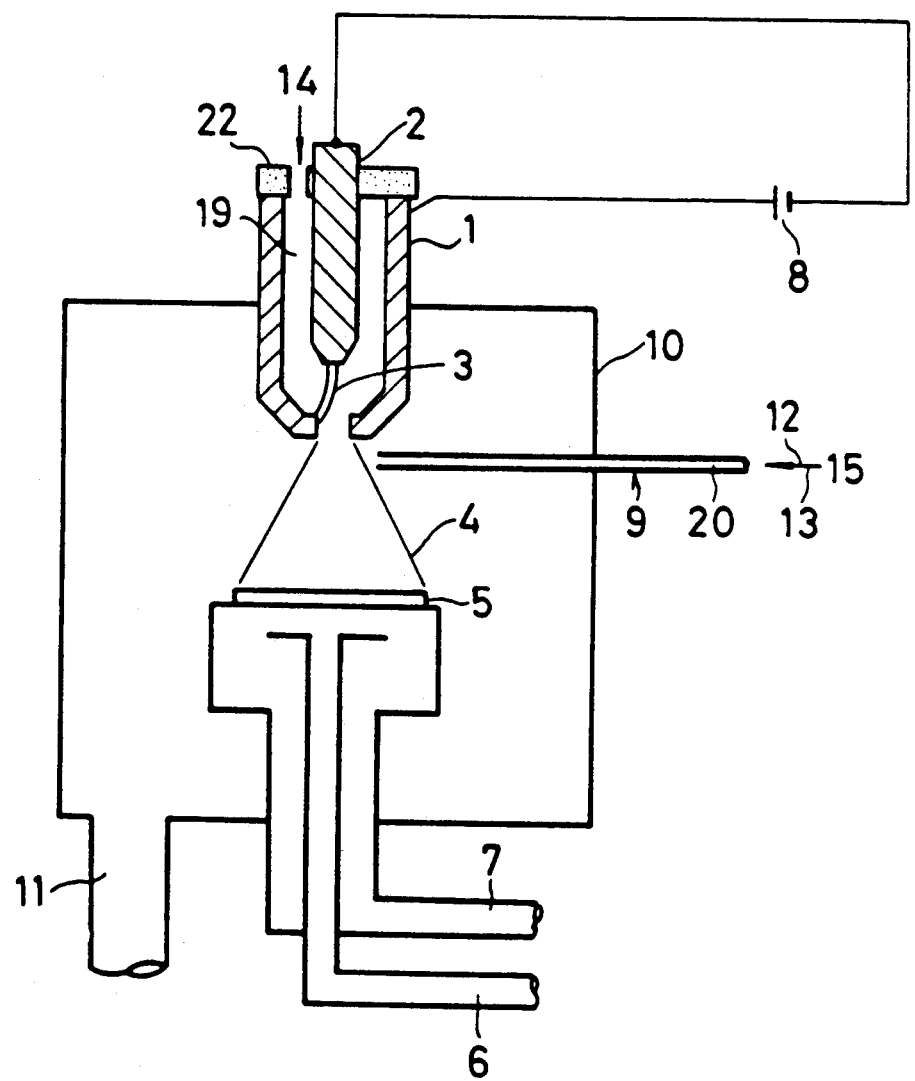
FIG. 1 is a vertical section showing the first embodiment of this invention.

The first embodiment has a construction as shown in FIG. 1, in which a concentric cylindrical anode 1 is arranged to encircle a cylindrical cathode 2, a cylindrical plasma gas passageway 19 being defined by both the discharge electrodes 1 and 2. An arc 3 is maintained by a potential difference produced by a DC power supply 8 between the discharge electrodes 1 and 2, and a plasma gas 14 flows through the plasma gas passageway 19, forming a plasma flame 4.

In a direction intersecting with the plasma flame 4 is arranged a feed tube 9 serving as a flow passageway 20, through which a mixture of methane gas serving as raw material gas 12 and hydrogen gas 13 flows. The plasma 4 contains a mixture of the raw material gas 12 and hydrogen 13 of a predetermined ratio of 80 VOL % of hydrogen. This ratio is desirably 80 VOL % or more, because if it is less than 80 VOL %, the ratio of so-called etching gas, hydrogen gas indispensable to the development of crystals decreases, at the same time the ratio of the raw material gas 12 containing carbon increases, and thus the deposited diamond may contain amorphous carbon or graphite-like carbon.

If the ratio is not less than 90 VOL %, a diamond of very high purity is obtained, but depositing rate is relatively slow.

When a substrate 5 is kept by cooling at predetermined temperatures between 700° and 1150 ° C., the diamond is deposited on the side surface of the plasma flame 4 above the substrate 5. In FIG. 1, numeral 6 indicates a cooling water inflow tube, 7 a cooling water spill tube, and 11 a gas outlet of a container 10, respectively.

Figure 2:
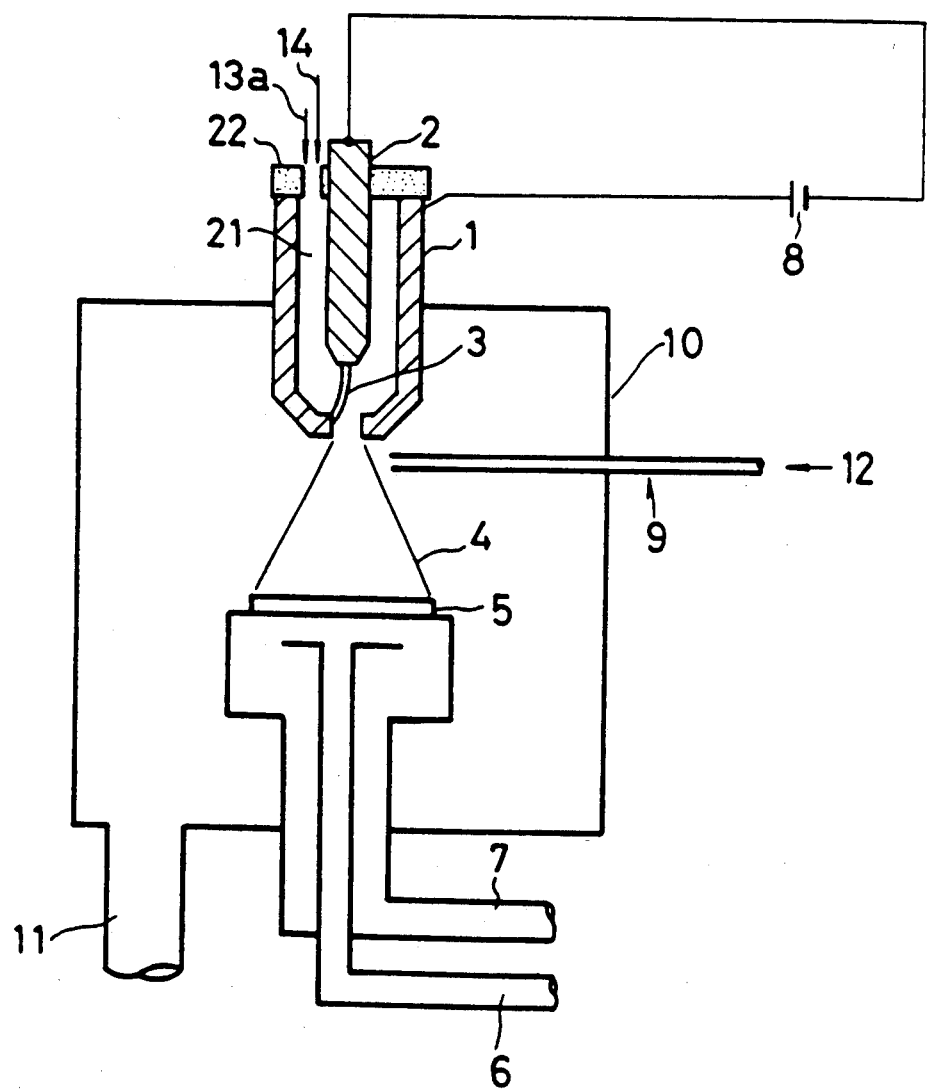
FIG. 2 is a vertical section showing the second embodiment of the invention, in which another embodiment in FIG. 1 is shown.

The second embodiment shown in FIG. 2 which is basically the same as that of FIG. 1, wherein the hydrogen gas 13a is fed through a passageway 21 through which a mixture of plasma gas 14 and hydrogen gas 13a formed by the anode and the cathode 1 and 2 in a plasma generating apparatus flows.

The raw material gas 12 containing carbon must not flow through the same passageway as does the plasma gas 14, due to precipitation of carbon in the plasma gas passageway and short circuiting of both the discharge electrodes 1 and 2 occurring, mixture of the hydrogen gas 13a with the plasma gas 14 is preferable from the viewpoint of stability of the plasma flame 4.

In a combined construction of the embodiments shown in FIG. 1 and FIG. 2 respectively, wherein the hydrogen gas 13a is mixed with the plasma gas 14, at the same time the hydrogen gas 13 is mixed with the raw material gas 12, and thus the purpose of this invention, quick production of highly pure diamond, is possible. Although a feed tube 9 shown in FIGS. 1 and 2 is a single tube, the raw material gas can be supplied from a plurality of feed tubes encircling the plasma flame 4. The hydrogen gas can also be supplied separately from the plasma gas or raw material gas. The above is also true in the following embodiments described.

Figure 3:
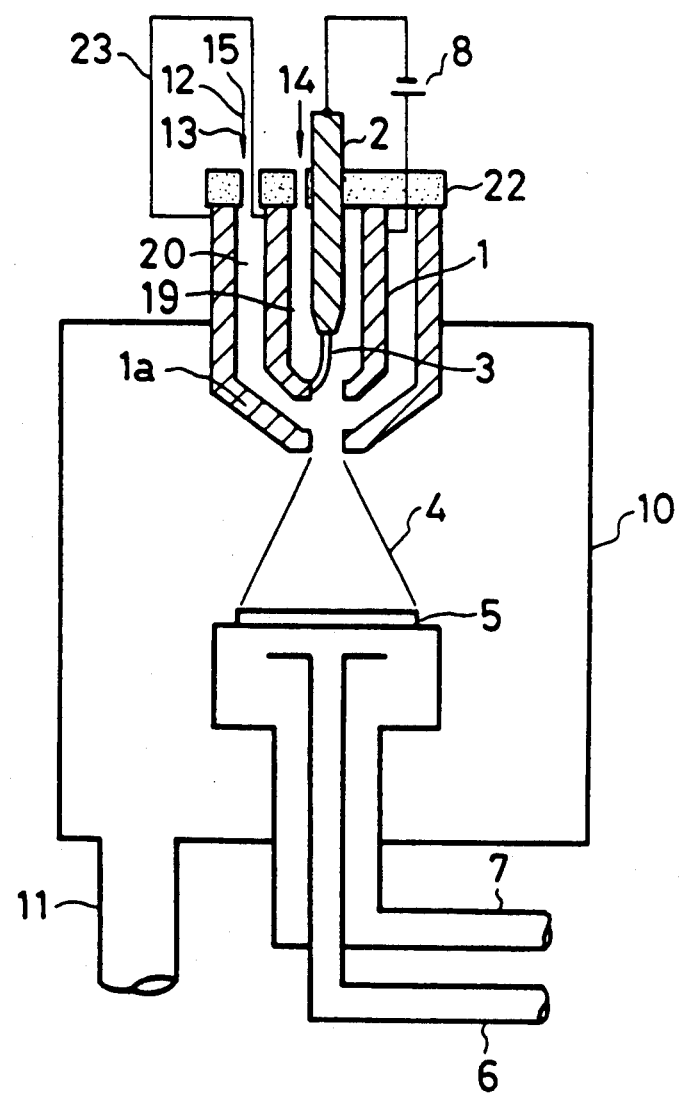
FIG. 3 is a vertical section illustrating the third embodiment.

The third embodiment is constructed as shown in FIG. 3, in which a passageway 20 is for mixed gas 15 consisting of the raw material gas 12 and the hydrogen gas 13 is so defined as to envelope the plasma generating apparatus, the construction comprising the passageway 20 for the mixed gas 15 being connected via a conductor 23 to produce the same electric potential.

With this construction, carbon is not precipitated in the plasma gas passageway 19 defined by both the discharge electrodes 1 and 2 where potential difference is produced, and thus it is possible to maintaining the potential difference.

If carbon is precipitated on the outside of the anode 1 or on the inside of an outermost cover 1a, since the anode 1 and the outermost cover 1a are so connected via the conductor 23 as to maintain potential difference 0, the potential difference between the discharge electrodes 1 and 2 is stably maintained without any electric influence.

Because of the above, the arc 3 and the plasma flame 4 are also stably maintained, and carbon is precipitated to an extent which does not block the passageway 20 so that no hindrance occurs to the mixture of the raw material gas 12 and the hydrogen gas 13 to the plasma flame 4, a mixture of plasma flame 4 with the raw material gas 12 thus being stably formed, with the result that a continuous supply of the diamond is produced.

Figure 4:
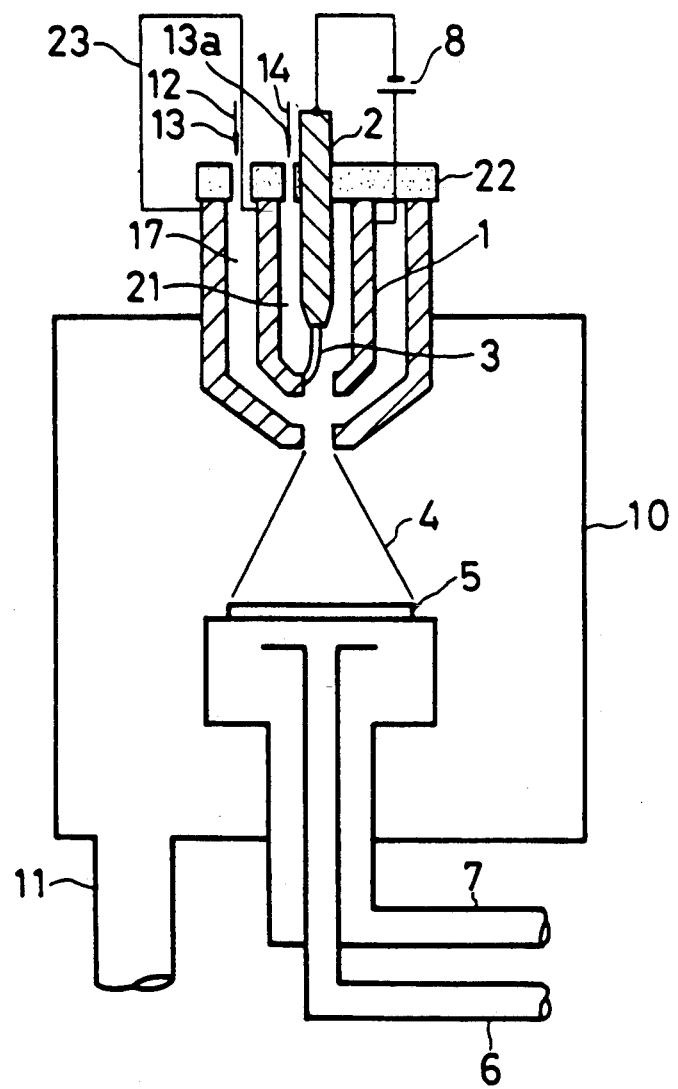
FIG. 4 is a vertical section showing the forth embodiment, in which another embodiment in FIG. 3 is shown.

The fourth embodiment is constructed as shown in FIG. 4, and has almost the same construction as the embodiment shown in FIG. 3. In this embodiment, the hydrogen gas 13a mixed with the plasma gas 14 is supplied to the arc 3 through the passageway 21 at the same time the raw material gas 12 is supplied to a passageway 17.

Mixing the hydrogen gas 13a with the plasma gas 14 and the raw material gas 12 is possible.

Figure 5:
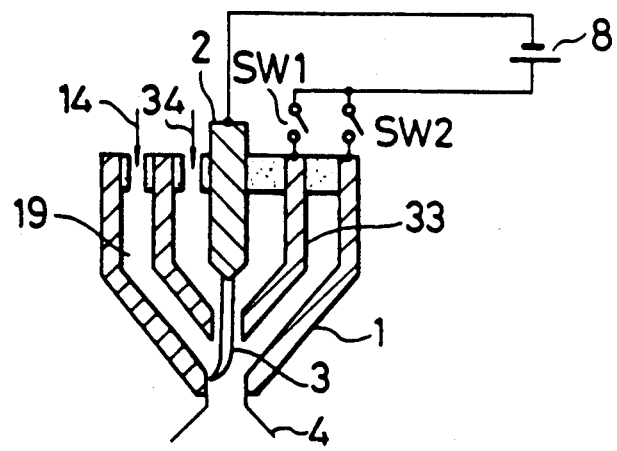
FIG. 5 is a vertical section depicting the fifth embodiment.

In the fifth embodiment shown in FIG. 5, a single torch is utilized. Between the cathode 2 and the anode 1 is arranged a cover 33.

With a switch SW1 closed and a switch SW2 opened, the DC power supply 8 and a high frequency high voltage generating apparatus (not shown) generates an arc 3 between the cathode 2 and the cover 33.

When the switch SW1 is opened after the switch SW2 is closed, an arc 3 is generated between the cathode 2 and the anode 1.

A small amount of inert gas such as argon (Ar) is flowed to protect the cathode 2 and the plasma gas 14 is flowed to the plasma gas passageway 19 between the cover 33 and the anode 1.

The characteristics of the torch are as follow:

1. Though the hydrogen gas 13 is added to the plasma gas 14, ionized hydrogen is less likely to hit the highest temperature cathode spot at the tip of the cathode so that the tip of the cathode 2 is less subject to wear, and thus the arc 3 is stably generated for a long period of time.

As a result of the above, the diamond are stably produced for long time.

2. Tungsten (W) is generally used for the cathode 2. When the tip of the cathode 2 wears, worn tungsten (W) scatters causing impurity in the plasma flame 4, lowering purity of the diamond produced. As described above, however, in the torch, the tip of the cathode 2 is less subject to wear so that tungsten (W) disperses less. Further, since a small amount of the scattered tungsten (W) mainly adheres to the inside of the cover 33, the plasma flame 4 contains hardly any tungsten (W), and the diamond of high purity are thus produced.

Figure 6:
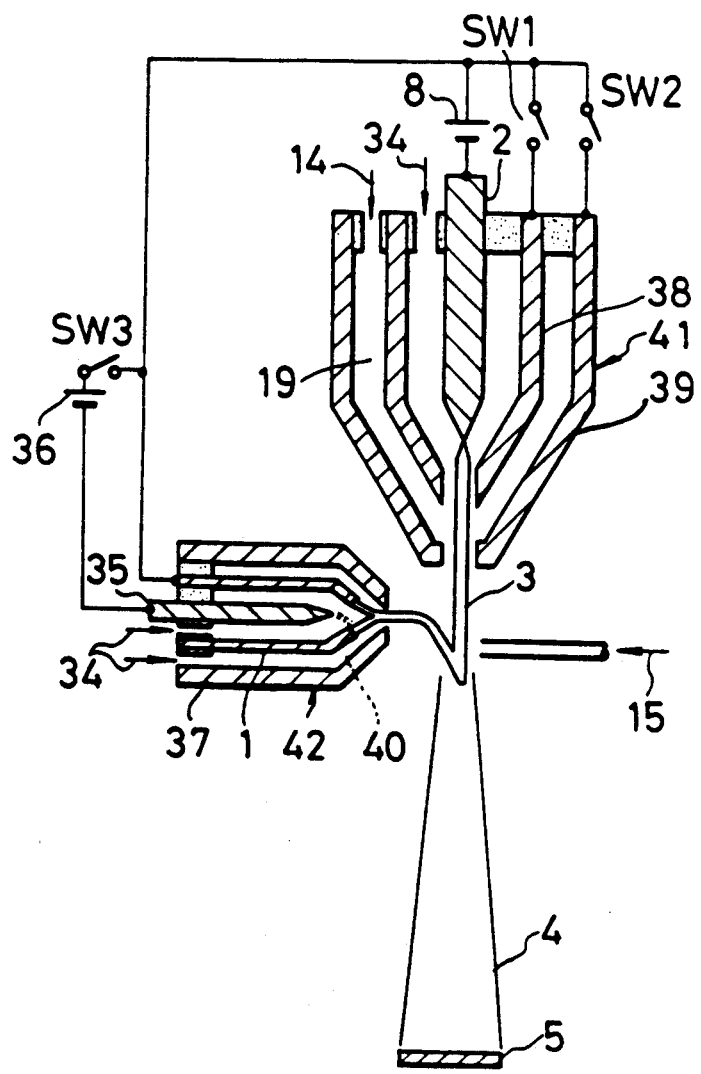
FIG. 6 is a vertical section illustrating the sixth embodiment.

In the sixth embodiment a multiple torch shown in FIG. 6 is used.

The multiple torch is characterized in that it has a cathode nozzle 41 and an anode nozzle 42 as shown in FIG. 6, and is so arranged that the central axis of each of the nozzles 41 and 42 intersect each other.

A first cathode cover 38 is arranged around the cathode 2 and a second cathode cover 39 is further arranged on the outside thereof.

Between the first cathode 38 and the second electrode 39 is defined the plasma gas passageway 19.

A small amount of inert gas such as Ar flows between the cathode 2 and the first cathode cover 38 to protect the tip of the cathode 2. The plasma gas 14 flows through the plasma gas passageway 19 between the covers 38 and 39.

An auxiliary cathode 35 is disposed inside of the anode 1 and an anode cover 37 is disposed on the outside thereof.

A small amount of inert gas, e.g. argon (Ar), flows to the inside and the outside of the anode 1, respectively. Inert gas further flows between the auxiliary cathode 35 and the anode 1 while an arc 40 is formed at ignition. However, it does not necessarily flow when the arc 3 is formed.

With the switch SW1 closed and the switch SW2 open, the DC power supply and the high frequency high voltage generating apparatus (not shown) generate an arc between the cathode 2 and the cover 38.

When the switch SW2 is closed before the switch SW1 is opened, an arc is generated between the cathode 2 and the area in proximity to the front end of the cover 39 and then the arc between the cathode 2 and the cover 39 disappears. With the switch SW3 closed, an auxiliary power supply 36 and the high frequency high voltage generating apparatus (not shown) generate an arc 40 at ignition between the anode 1 and the auxiliary cathode 35.

Under the above conditions, when the switch SW2 is opened, an arc is generated between the anode 1 and the cathode 2.

Under the above condition, the auxiliary power supply 36 is stopped when the switch SW3 is open.

The arc is stably formed by the procedures described above.

The torch has the following characteristics other than the characteristics described in 1 and 2 of the fifth embodiment:

3. For example since one end of the arc 3 is secured to the end of the cathode 2 and the other to the end of the anode 1, the arc 3 is very stable and does not move. The plasma flame 4 thus has a stable laminar flow. The length of the laminar flow-like plasma flame 4 can be several times longer than that of a turbulent flow-like plasma flame. Sufficient staying time of the raw material gas 12 in the plasma flame 4 expedites reaction and quicker production of the diamond.

4. Because the raw material gas 12 or the hydrogen gas 13 can be fed to the most active arc 3, forming reaction is active.

5. Since the long arc 3 increases the arc voltage and an arc output increases in the current of the same arc, a large amount of energy for the reaction can be supplied. As a result of the above, production speed of the diamond becomes faster.

6. Copper is generally used as the material of the anode 1, where the tip thereof is protected by inert gas such as argon (Ar) so that the material hardly wears.

Long stable service is thus achieved and extremely little scattering of the copper result in rapid production of highly pure diamond.

A third cathode cover is arranged outside of the second cathode cover (not shown) and inert gas or plasma gas flows between both of the cathode covers, so that it is possible to increase the stability of the arc 3 and the characteristics described in items 1 through 6 above are achieved. Raw material gases used for this invention are as follow: chain or cyclic saturated hydrocarbons such as methane, ethane, propane, butane, pentane, octane, or cyclohexane; unsaturated hydrocarbons containing double or triple bond such as ehylene, propylene, butadiene, benzene, styrene, acetylene, or allene; nitrogen-containing compounds such as allyamine, methylamine, ehylamine, pyridine, picoline, or acrylamido; ion-containing compounds such as carbon disulfide, methylmercapta, or ethylmercaptan; alcoholic compounds such as methanol, ethanol or propanol; aldehyde compounds such as formaldehyde, or acetaldehyde; and organic acids such as formic acid or acetic acid and alkyl esters of these acids such as ethyl ester or methyl ester.

Of these gases, methane, ethane, propane, butane, butadiene, allyamine, methylamine, ethylamine, carbon disulfide, methanol, ethanol, formaldehyde, acetaldehyde, methyl ethyl ketone, formic acid and ethyl acetate are most desirable.

Organic compound-containing gases fed for forming organic compound-containing gas plasma include one or more type of the organic compounds cited above. For example, oxygen, hydrogen, nitrogen, nitric monoxide, nitrogen dioxide, carbon monoxide, carbon dioxide, hydrogen sulfide, water, helium, argon and xenon are acceptable, if they contain the same or less mol degrees as the first cited gases.

The raw material gas containing carbon may include compounds containing carbons such as hydrocarbon, alcohols or ethers and hydrogen, or may include mixtures of these compounds and hydrogen.

The hydrogen gas 13 is not necessarily hydrogen, it may be any matter such as steam or hydrogen sulfide which decomposes in the plasma flame to generate hydrogen.

Further, the substrate 5 is not limited in its material as long as it is heat resistant. For example, ceramic materials like silicon, silica, glass or nitriding silica; metallic materials like molybdenum, tungsten, tungsten carbide, cobalt-containing tungsten carbide or iron; or compound materials of the above may be used for the substrate.

FIGS. 7 to 17 show the embodiments for separating the diamond deposited when the the diamond develops to suitable grains in diameter.

Figure 7:
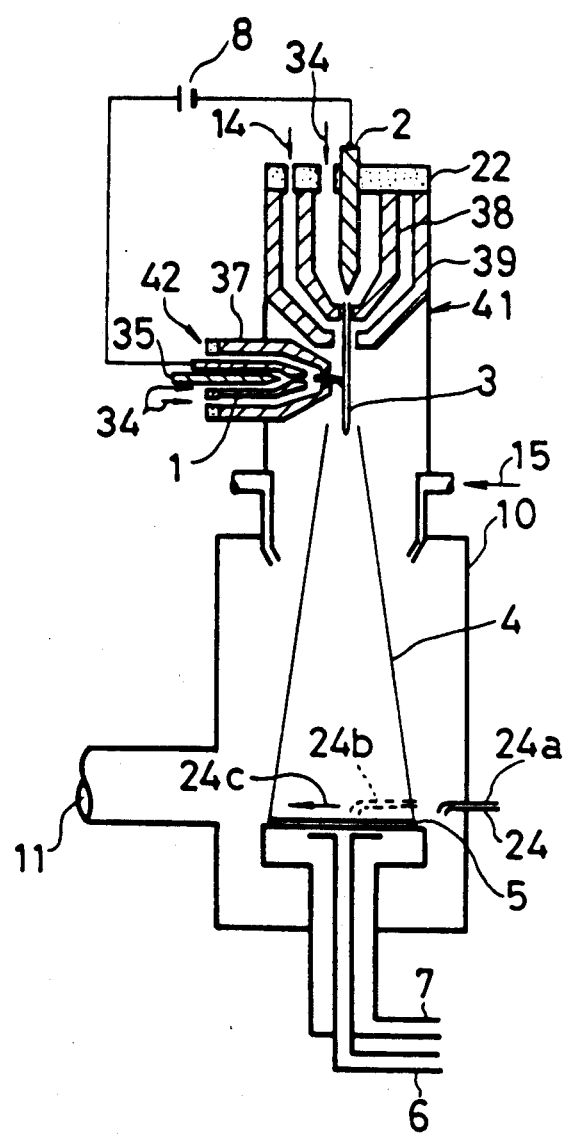
FIGS. 7 to 16 are vertical sections showing each of the embodiment.

FIG. 7 shows the construction of a gas spraying apparatus to separate the diamond deposited by spraying O group element gases, hydrogen gas or mixtures of both.

The gas spraying apparatus 24 is positioned at 24a during the production of the diamond, and travels during the separation of the diamond to the direction of 24c, while spraying gas to the substrate 5 at the same time.

The reference character 24b indicates the gas spraying apparatus while it is traveling.

With the repeated operation of the above, the diamond produced by gas spraying cool rapidly and crack by thermal shock. Such deposited diamond is separated by the wind pressure of the gas.

Figure 8:
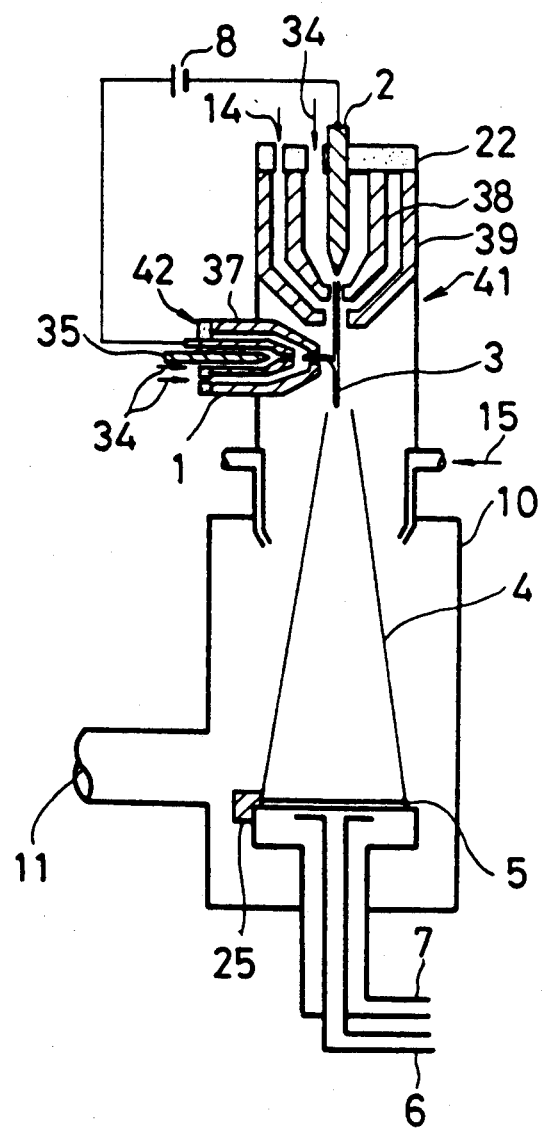

FIG. 8 shows a vibrating separation apparatus 25 to separate the diamond by vibrating the substrate 5.

Figure 9:
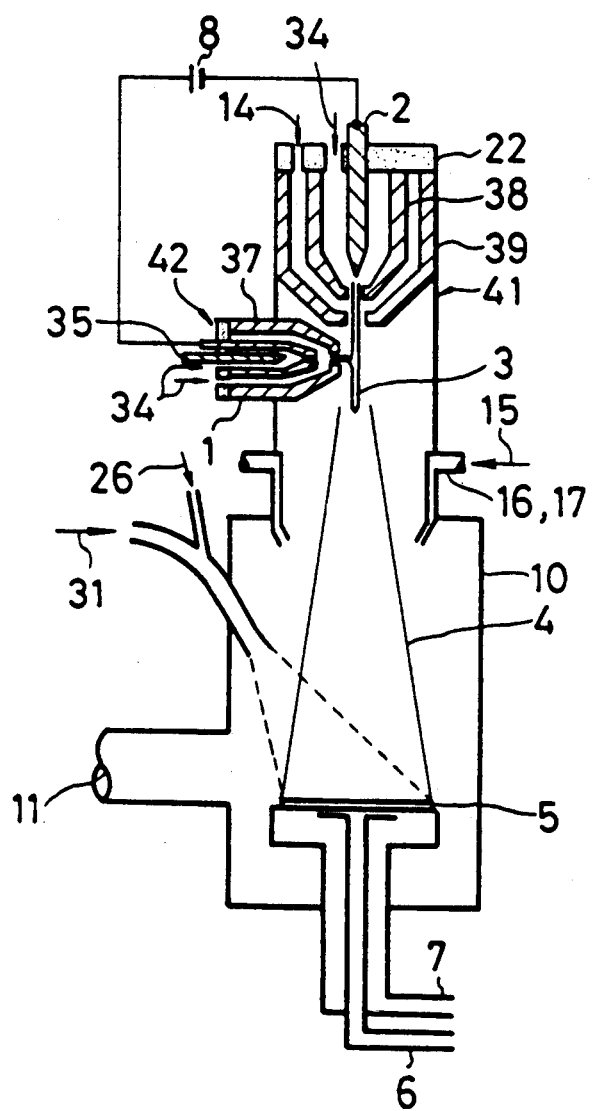

FIG. 9 shows the construction of a blast apparatus where the deposited diamond on the substrate 5 is separated by blasting, with the flow of gas 31, grains whose specific gravity is very different from that of the diamond easily separated by the specific gravity difference sedimentation method.

Figure 10:
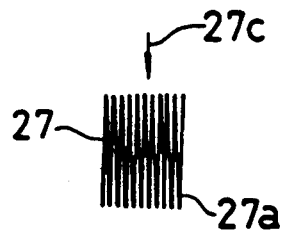
Figure 11:
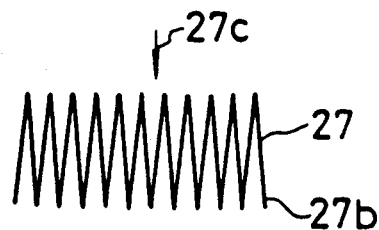

FIGS. 10 and 11 show the embodiments of an expandable bellows-like substrate.

At the diamond deposition stage, the substrate 27 is contacted as shown by 27a of FIG. 10. The plasma flame 4 flows from the direction intersecting with the direction 27c.

When the diamond is separated, diamond grains are obtained by extending the substrate as shown by 27b of FIG. 11.

Figure 12:
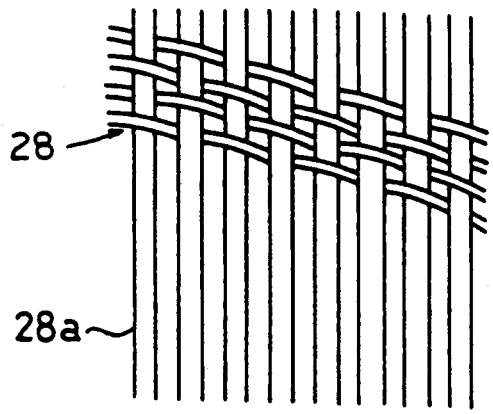
Figure 13:
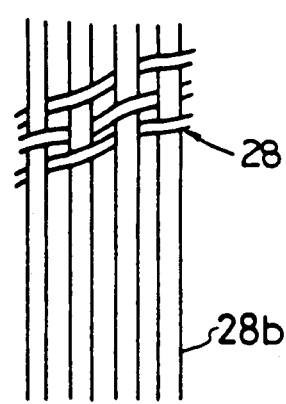

FIGS. 12 and 13 show a substrate 28 defined by flexible material which can be deformed.

Diamonds are deposited in the form of 28a of FIG. 12 and then separated in the deformation of 28b of FIG. 13.

Figure 14:
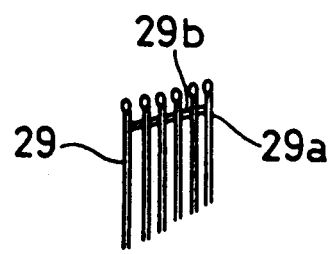
Figure 15:
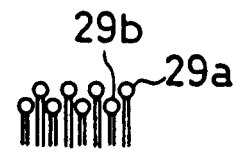

FIGS. 14 and 15 show the embodiment of a finely separable substrate 29 having collections of needle-like bars 29a and 29b which can be unevenly and alternately crossed.

During diamond deposition, the tip of the needle-like substrate is a plane, however, it unevenly moves again and again when the diamond is separated.

Figure 16:
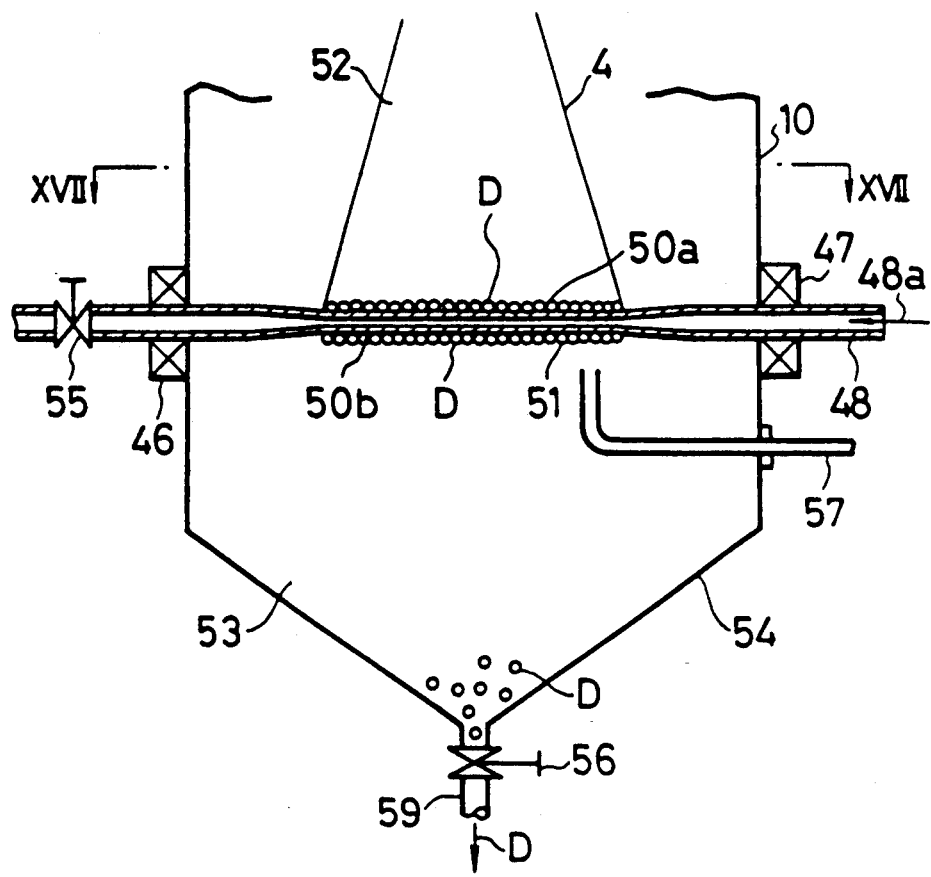
Figure 17:
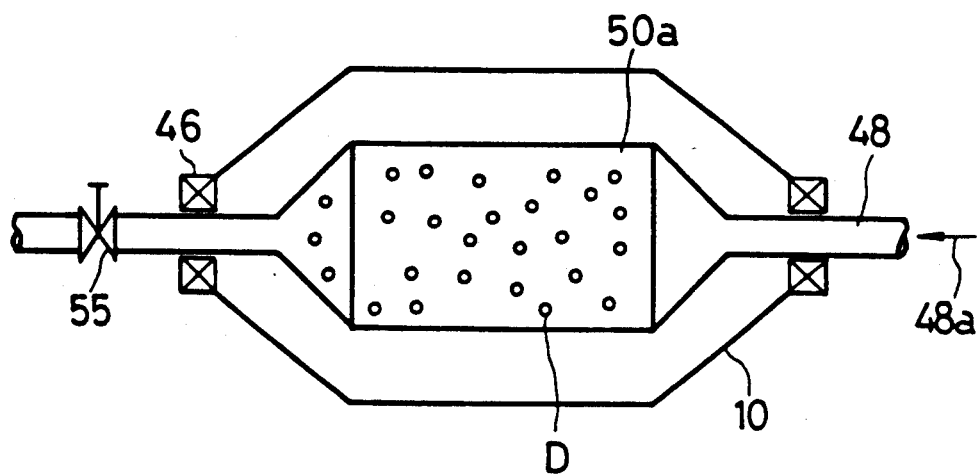
FIG. 17 is a vertical section taken substantially on line XVII—XVII of FIG. 16.
Figure 18:
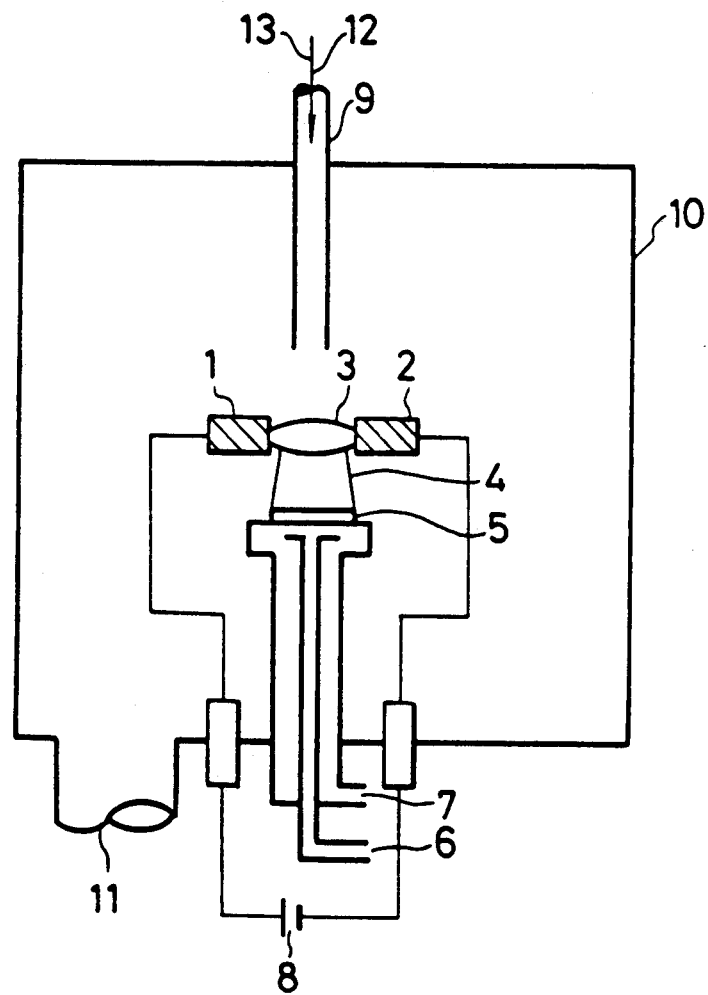
FIGS. 18 and 19 are vertical sections showing embodiments of the conventional type.
Figure 19:
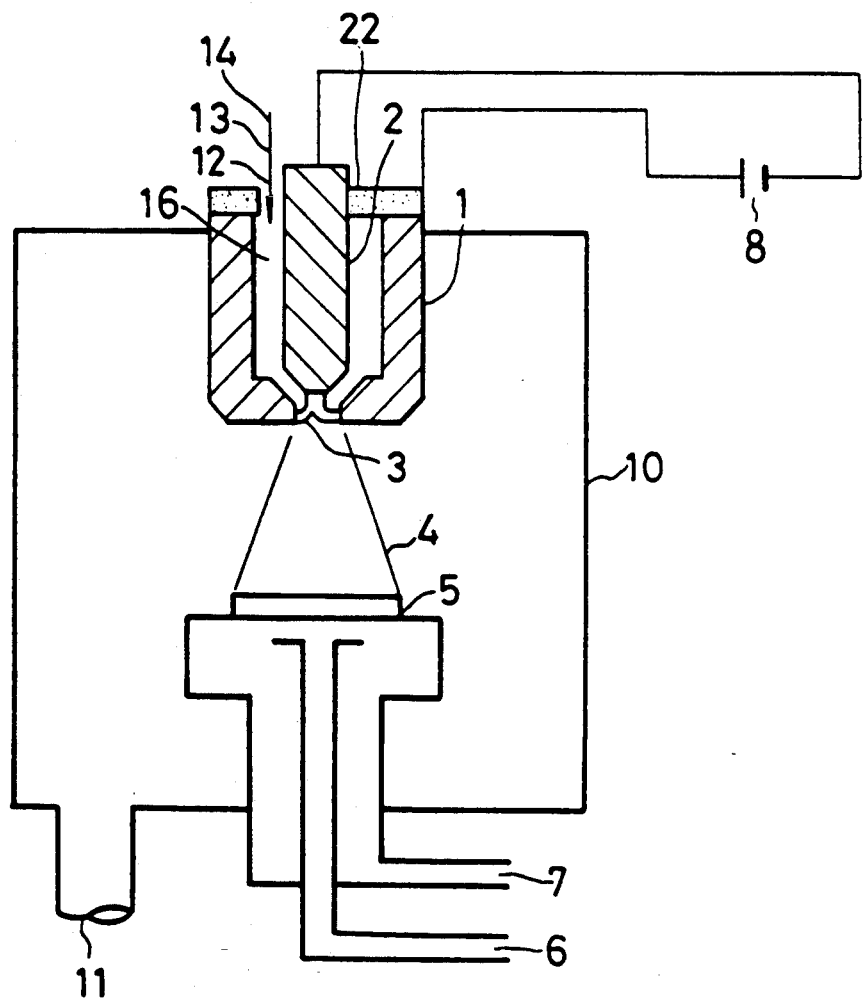

FIGS. 16 and 17 show another embodiment in relation to a substrate for spraying impalpable powders of the diamond produced in the plasma flame 4. In these FIGS., a cooling pipe 48 where a part thereof is flatly defined, level-like substrates 50a and 50b being defined on both the sides thereof, and a level-like cooling water passageway 51 being arranged between the substrates 50a and 50b, is rotatably supported by a pair of bearings 46 and 47. A container 10 defining a space 52 to deposit the impalpable powders of the diamond D is disposed on the side of the substrate 50a and a separation container 54 defining a space 53 to separate the deposited diamond D is disposed on the side of the substrate 50b. A valve 55 on one end of the cooling pipe 48 opens to feed cooling water 48a in a water screenlike manner from the other end of the pipe through the cooling water passageway 51. With the substrates 50a and 50b kept cooled, the diamond is thus produced on the substrate 50a. After the produced diamond described above develops to a predetermined thickness, the cooling pipe 48 supported by the bearings 46 and 47 rotates halfway so as to place the substrate 50a and the deposited diamond in the separation space 53. After the above procedures, a gas spraying apparatus 57 sprays gas on the diamond in the separation space 53. The diamond is so separated from the substrate 50a that they fall onto the bottom of the container 54, where the diamond, with a valve 56 opened, is extracted from an outlet 59.

Deposition and separation of the diamond are thus alternately performed in different spaces, contributing to the improved efficiency of the diamond production.

Further, in the above case, although not shown in the FIGS., it is also possible to separate the diamond by, instead of the above gas spraying apparatus, a scraper, vibrating water through the cooling water passageway 51 while continuously opening and closing the valve 55, by the application of ultrasonic waves, or by provision of a proper agitator.

The substrate also so slides away to a position where it is not affected by a high temperature flame and the like in order that the diamond D may be separated.

This invention is constructed as described above so that the plasma gas flows substantially in parallel with the arc formed between a pair of the discharge electrodes.

As a result, the plasma flame, compared with one produced by conventional DC arc discharge plasma methods, is formed much more stably and for a longer time, and flows smoothly. Since a plasma flame containing high energy can be thus formed, when the raw material gas flows to the upstream of the plasma flame the time required for the raw material gas to react is prolonged extremely, therefore activating the hydrogen remarkably.

Accordingly, the diamond of high purity are produced quickly.

Further, because the raw material gas, separated from the plasma gas, directly flows to the plasma flame, unlike conventional embodiments, partial precipitation of the carbon in the plasma generating apparatus does not cause electric short circuiting between the cathode and the anode. A lack of addition of carbon or the like from the discharge electrode to the plasma flame contributes to the production of highly pure diamond, and stable formation of the plasma flame permits long continuous service.

When the diamond is produced by a diamond production apparatus and method according to this invention, reaction progresses sufficiently in the stable plasma flame, resulting in the achievement of an unprecedented production speed exceeding 800 μm per hour as well as production of diamond so pure that no impurity, such as for example amorphous or graphite-like carbon, can be detected.

What is claimed is:
1. An apparatus for making a diamond comprising:
a plasma gas passageway, including means for feeding plasma gas to said passageway;

a pair of discharge electrodes comprising an anode and a cathode arranged in a concentric manner across said plasma gas passageway;

a hydrogen ion-source gas passageway, including means for feeding a hydrogen ion-source gas to said hydrogen ion-source gas passageway;

a power source adapted to generate an arc between said electrodes for generation of a plasma flame;

a plasma flame generating zone;

a substrate arranged so as to oppose the ends of said discharge electrodes across said plasma flame generating zone, said substrate including a cooling means; and a raw material gas passageway, including means for feeding raw material gas or a mixture of raw material gas and a hydrogen ion-source gas to said raw material gas passageway, said raw material gas passageway being arranged in said plasma flame generating zone at a downstream side of the anode of said discharge electrodes, with the provison that said raw material gas passageway is not in communication with said plasma gas passageway.

2. An apparatus for making a diamond as claimed in claim 1 comprising said plasma flame being a laminar flow.

3. An apparatus for making a diamond as set forth in claim 1 comprising said plasma flame having a smooth flow.

4. An apparatus for making a diamond according to claim 1 comprising said plasma gas feed means being a passageway in a concentric manner in relation to the anode.

5. An apparatus for making a diamond according to claim 1 including a concentric cover positioned around the cathode and an inert gas passageway for providing at least one inert gas to the annular space between said concentric cover and the cathode.

6. An apparatus for making a diamond according to claim 5 wherein said inert gas is selected from the group consisting of the group O elements of the periodic table.

7. An apparatus for making a diamond according to claim 1 comprising said substrate having separation means for the diamond.

8. An apparatus for making a diamond according to claim 1 wherein said substrate is formed in a bellows-like shape.

9. An apparatus for making a diamond according to claim 1 wherein said substrate is made from flexible materials.

10. An apparatus for making a diamond according to claim 1 wherein said substrate is constructed of a hollow flat board.

11. An apparatus for making a diamond according to claim 10 wherein said hollow flat board is in communication with a cooling valve supported by bearings.

12. An apparatus for making a diamond comprising:
a plasma gas passageway, including means for feeding plasma gas to said passageway;
a hydrogen ion source gas passageway, including means for feeding said hydrogen ion source gas to said hydrogen ion source gas passageway;
a cathode nozzle comprising sequentially-spaced a first and a second cathode cover concentrically disposed one after another in the periphery of a cathode;
an anode nozzle comprising sequentially-spaced an anode and an anode cover concentrically disposed one after another in the periphery of an auxiliary cathode so that the central axis of each nozzle crosses each other;
a power source adapted to generate an arc between said cathode and said anode for generation of a plasma flame;
a plasma flame generation zone;
a substrate arranged opposite said cathode nozzle across said plasma flame generating zone; said substrate including a cooling means; and
a raw material gas passageway, including means for feeding raw material gas or a mixture of raw material gas and a hydrogen ion-source gas to said raw material gas passageway, said raw material gas passageway being disposed downstream from said cathode nozzle within said plasma generating zone, with the provison that said raw material gas passageway is not in communication with said plasma gas passageway.

13. An apparatus for making a diamond according to claim 12 comprising said substrate having separation means for the diamond.

14. An apparatus for making a diamond according to claim 12 wherein said substrate is formed in a bellows-like shape.

15. An apparatus for making a diamond according to claim 12 wherein said substrate is made from flexible materials.

16. An apparatus for making a diamond according to claim 12 wherein said substrate is constructed of a hollow flat board.

17. A method of making a diamond comprising the steps of:
forming an arc by electric discharge between a pair of discharge electrodes;
feeding a plasma gas comprising at least one inert gas substantially in parallel with said arc, and forming a plasma flame extending outwardly from said arc and away from said electrodes;
feeding a raw material gas comprising a source of carbon or a mixture of a raw material gas and a hydrogen ion-source gas into said plasma flame downstream from said arc, whereby said source of carbon is decomposed within said plasma flame to carbon ions, carbon radicals and mixtures thereof, and said raw material gas is not in communication with said plasma gas;
introducing a hydrogen ion-source gas into said plasma flame by at least one of separately, in admixture with said plasma gas, and in admixture with said raw material gas; and
precipitating said diamond on a substrate having heat transfer means and arranged close to the downstream of said plasma flame.

18. A method of making a diamond according to claim 17 wherein said raw material gas flows substantially in parallel with said plasma gas and is separately introduced into said plasma flame downstream from said arc.

19. A method of making a diamond according to claim 17 wherein said raw material gas flows in a direction intersecting with the direction of said plasma gas flow.

20. A diamond produced according to the method of claim 17.

* * * * *